INVENTOR.
GERALD B. HERZOG
BY John V. Regan
ATTORNEY

INVENTOR.
GERALD B. HERZOG
BY John V. Regan
ATTORNEY

United States Patent Office 3,096,445

Patented July 2, 1963

3,096,445

SQUARE WAVE GENERATOR COMPRISING NEGATIVE RESISTANCE DIODE AND MISMATCHED DELAY LINE PRODUCING STEEP EDGE PULSES

Gerald B. Herzog, Princeton, N.J., assignor to Radio Corporation of America, a corporation of Delaware Filed Nov. 13, 1959, Ser. No. 852,743
7 Claims. (Cl. 307—88.5)

The present invention relates to new and improved circuits for producing pulses.

An object of the invention is to provide an improved circuit for producing square pulses having very steep leading and lagging edges.

Another object of the invention is to provide an improved pulse width modulation circuit.

The circuit of the present invention includes a negative resistance diode and delay line which is mismatch at its far or receiving end coupled to the diode. The diode may be forward biased to a value such that it can assume either one of its two stable states. A pulse switches the diode from one stable state to the other. The pulse also passes down the delay line, is reflected back from its far end, and, when of suitable polarity, switches the diode back to its original stable state. A square output pulse having short rise and fall times is thereby produced. If the delay line is short-circuited, the duration of the output pulse is equal to twice the delay line length; if the delay line is open-circuited, the duration of the output pulse is equal to four times the delay line length.

In a second form of the present invention useful as a pulse width modulator, the delay line employed is preferably electronically adjustable. The modulating signal is applied to the delay line and adjusts the delay produced by the delay line, whereby the output pulses across the diode will vary in width in accordance with the amplitude of the modulating signal.

The invention will be described in greater detail by reference to the following description taken in connection with the accompanying drawing in which.

Similar reference characters are applied to similar elements in the various figures.

Figure 1:
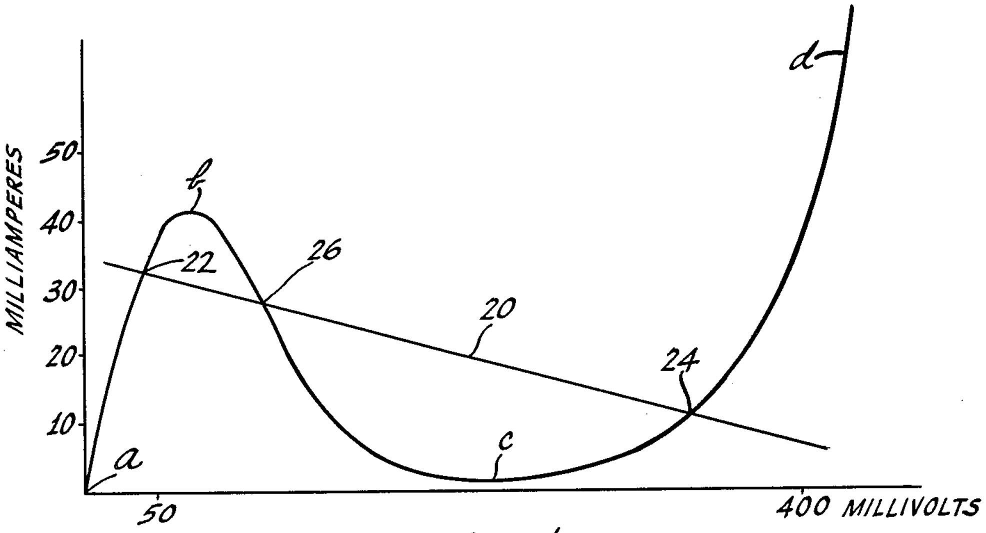
FIG. 1 is a curve of the volt-ampere characteristic of a negative resistance diode.

A characteristic curve of current versus voltage for a negative resistance diode (known also as a "tunnel" diode) is shown in FIG. 1. The values of millivolts and milliamperes given are typical but are not meant to be limiting. The milliampere range, for example, may differ substantially for different diodes. The portions *ab* and *cd* of the volt-ampere (E-I) characteristic are regions of positive resistance (the inverse of the slope, $$\frac{dE}{dI}$$

which is equal to resistance R, is a positive quantity). The portion *bc* of the volt-ampere characteristic is a region of negative resistance (the inverse of the slope of the portion *bc* is negative).

Figures 2, 3, 4:
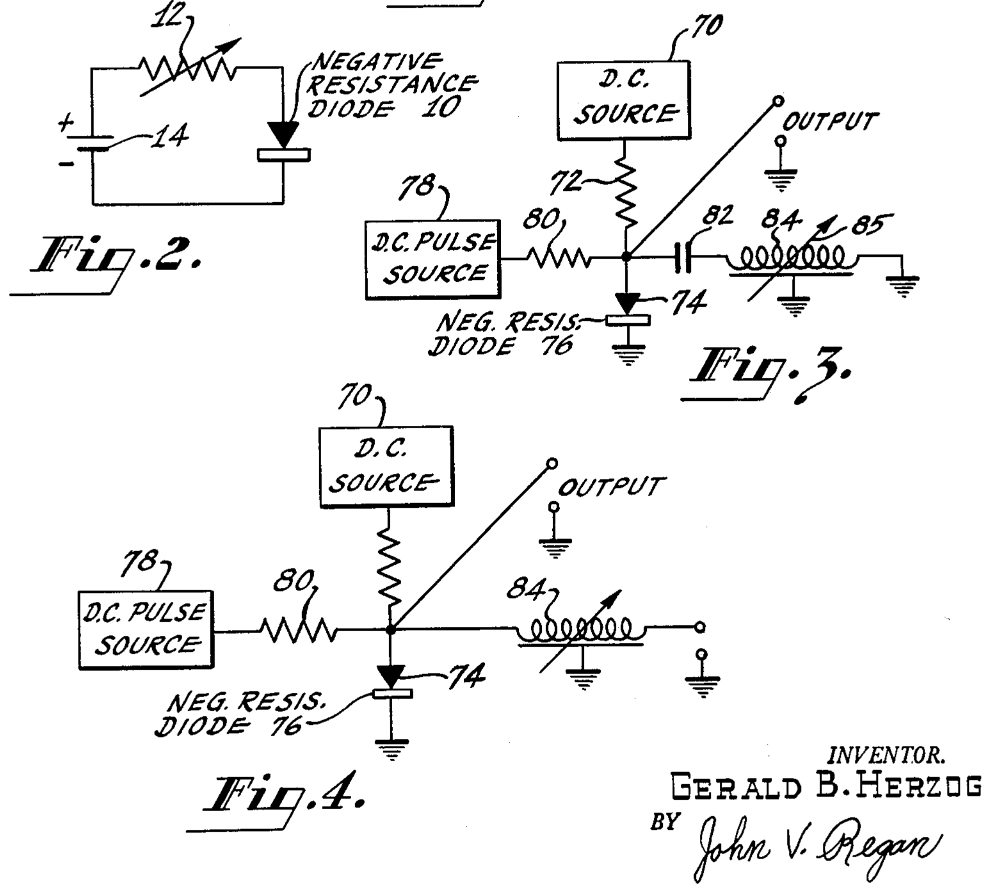
FIG. 2 is a simplified diagram of a circuit from which the curve of FIG. 1 may be derived.
FIGS. 3 and 4 are circuit diagrams of different embodiments of the present invention.

FIG. 2 illustrates a circuit from which the curve of FIG. 1 may be derived. It may include, in series, a negative resistance diode 10, a load resistor 12 and a source of voltage 14 for forward biasing the diode. The value of resistor 12 may include the internal resistance of the source 14. It is assumed for the present that the source and load resistor together have a value of resistance at least ten or so times the value of resistance of the negative resistance diode 10 and thereby act somewhat like a constant current source. In this event, the load line 20 (FIG. 1) has the slope indicated. If the source were a perfect constant current source, load line 20 would be parallel to the millivolt axis.

Load line 20 intersects the positive resistance region *ab* of the characteristic at 22 and the positive resistance region *cd* of the characteristic at 24. It also intersects the negative resistance region *bc* of the diode at point 26. The points 22 and 24 are stable operating points and the point 26 is an unstable operating point with a load line like 20.

Assume that initially the voltage across the diode is of the order of 30 millivolts or so. The current through the diode is about 30 milliamperes and the diode is at a stable low voltage state represented by the point 22. When the current through the diode is increased in the forward direction, for example, by changing the source voltage, the load line is shifted on the characteristic until it passes through point *b*. The point *b* represents a current of about 43 milliamperes. Increasing the forward current to a value greater than this drives the load line in the upward direction beyond the point *b* as viewed in FIG. 1. It is believed that the diode is thereby driven into its negative resistance region but, since the latter represents an unstable condition of the diode, the diode cannot remain there and rapidly switches to its second stable state—the intersection of the shifted load line and positive resistance region *cd*.

If, after the diode is switched, the current returns to the value indicated by the intersection of the load line 20 and the curve, the voltage reduces to a lower value as indicated by point 24. The point 24 or some other stable intersection point of a suitable load line and the positive slope region *cd* of the characteristic is hereafter termed the high voltage state of the diode and the point 22 or some other stable intersection point of the suitable load line and the positive portion *ab* of the characteristic is hereafter termed the low voltage state of the diode.

With a load line like 20, the diode may be switched from its low voltage state to its high voltage state by forward bias current pulses and from its high voltage state to its low voltage state by reverse bias current pulses. Pulses as short as 0.1–2 millimicroseconds have been found to be suitable for switching the diode.

One embodiment of the present invention is shown in FIG. 3. A direct-current (D.C.) source 70 is connected through load resistor 72 to the anode 74 of a negative resistance diode 76. A direct-current (D.C.) pulse source 78 is connected through a resistor 80 to the same anode 74. The diode-anode is connected through a coupling capacitor 82 to the sending end of a delay line 84. The receiving end of the delay line is short-circuit as, for example, by being grounded. The delay line may be of fixed or variable length, however, one of variable length is shown schematically by arrow 85.

The D.C. source 70 and resistor 72 and the pulse source 78 and resistor 80 act as constant current sources. The characteristic for the diode is as shown at *abcd* in FIG. 1 and the load line for the diode is as shown at 20 in FIG. 1.

Figure 6:
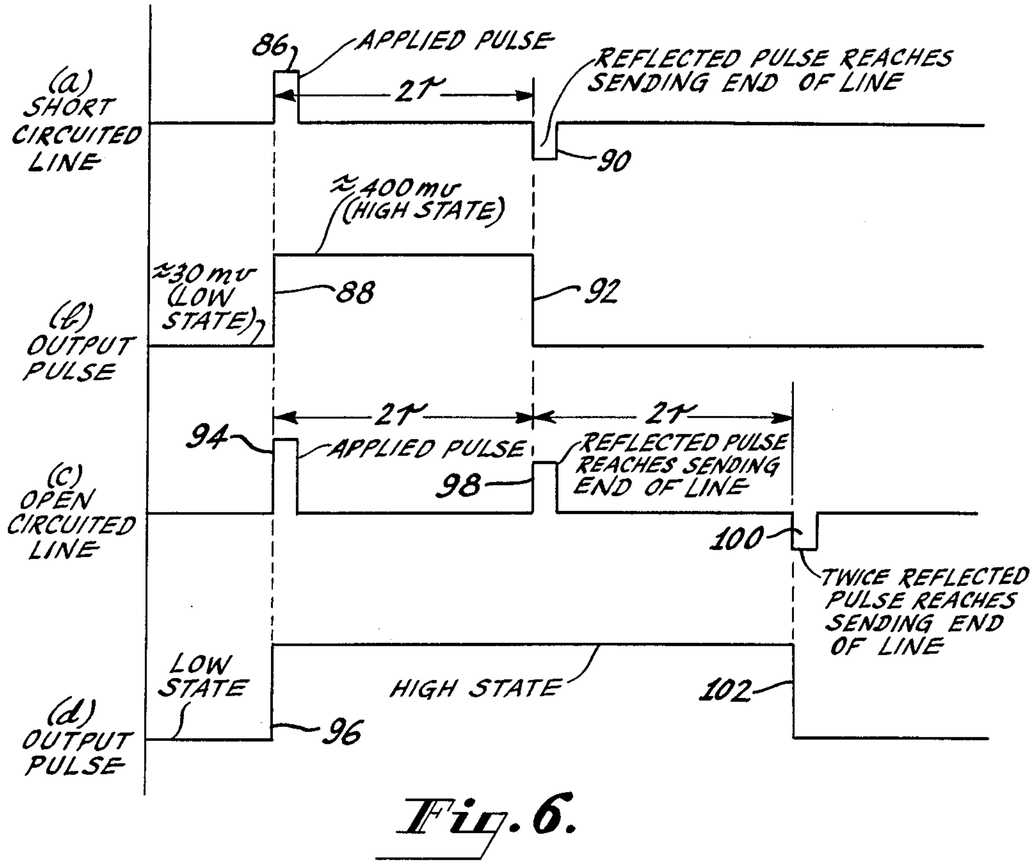
FIG. 6 is a diagram of waveforms to help explain the operation of the circuits of FIGS. 3–5.

The operation of the circuit of FIG. 3 may be better understood by referring to FIGS. 6*a* and *b*. It may be assumed that the diode is initially in its low voltage state as indicated by the intersection 22 (FIG. 1) of load line 20 with positive resistance region *ab*. Pulse source 78 applies a positive or forward bias pule to the diode 74 as shown at 86 in FIG. 6*a*. The diode thereupon switches from its low voltage state (about 30 millivolts) to its high voltage state (about 400 millivolts). The diode switching time is very fast (of the order of a millimicrosecond or less) so that the leading edge 88 (FIG. 6*b*) of the square wave which is produced is very steep. The positive pulse travels down the delay line to the short-circuited receiving end thereof. There, the pulse is inverted and is reflected back toward the ending end of the delay line and the diode. After a time $2\tau$, which is equal to twice the delay line length, a negative-going pulse 90 appears at the diode-anode 74. The pulse is of somewhat lower amplitude than the applied pulse 86 due to attenuation in the delay line and possible mis-matches present at the sending end of the line. However, the input pulse 86 is chosen to be of sufficient amplitude so that the reflected pulse 90 is sufficient, even after attenuation, to switch the diode 74 from its high voltage state back to its low voltage state. This produces the lagging edge 92 (FIG. 6*b*) of the square wave across the diode. This edge, like the leading edge, is also very steep and for the same reasons. The pulse width depends upon the delay line length and can be changed by changing the delay line length.

In the circuit of FIG. 3, improved performance results if the sending end of the delay line is matched in impedance to the diode. A transformer, resistor network, or other impedance matching means may be used for this purpose and may be placed in the same place in the circuit as block 110 of FIG. 5. The impedance match reduces the attenuation imparted to the pulses passing between the diole and delay line. While impedance matching gives improved performance, it has been found possible in practical circuits to produce a pulse similar to the one shown in FIG. 6*b* with sending end of the delay line mis-matched.

The embodiment shown in FIG. 4 is like the one shown in FIG. 3 except that the delay line is open-circuited rather than short-circuited. The coupling capacitor 82 of FIG. 3 need not be employed because the delay line no longer shunts the diode.

The operation of the circuit of FIG. 4 is illustrated in FIGS. 6*c* and *d*. Assume that the diode is initially in its low voltage state and that the delay line characteristic impedance is substantially higher than the diode resistance. The first applied pulse, a forward bias pulse, switches the diode to its high state producing the leading edge 96 of the square pulse. The applied pulse 94 travels down the delay line and is reflected from the open-circuited end thereof without reversal in polarity. After time $2\tau$, twice the delay line interval, the reflected positive pulse 98 reaches the diode-anode. However, the diode is already in its high state and the pulse 98 does not switch the diode. The diode has a relatively low value of resistance, of the order of 2 or 3 ohms or so, and looks to the sending end of the delay line substantially like a short circuit. Accordingly, the diode reflects the pulse 98 in opposite polarity (negative). The negative pulse travels down the delay line toward the receiving end thereof and is reflected in the same (negative) polarity. The reflected negative pulse, after an additional period $2\tau$, reaches the diode-anode as indicated at 100 in FIG. 6*c*. This negative pulse now switches the diode from its high state to its low state to provide the lagging edge 102 of the square pulse produced. Thus, the pulse produced by the open-circuited delay line will be twice the duration of the pulse produced by the short-circuited delay line. In this embodiment (the one of FIG. 4), the sending end of the delay line should not be matched in impedance to the diode impedance.

Figure 5:
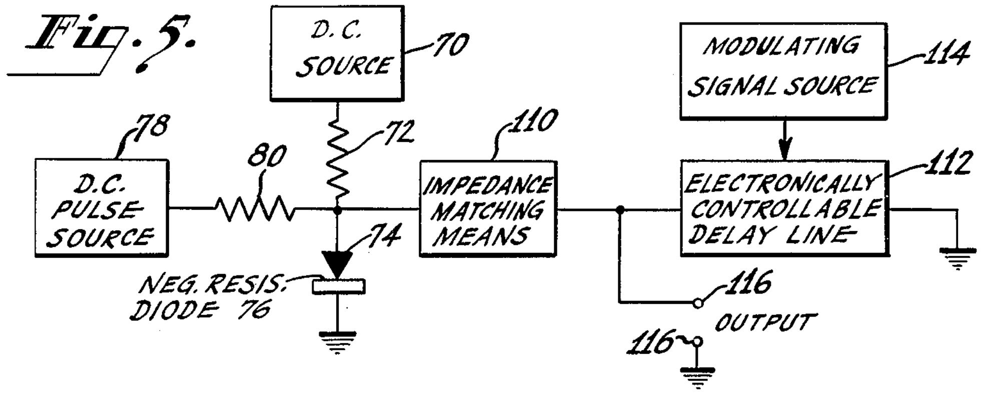
FIG. 5 is a block and schematic circuit diagram of a pulse width modulation circuit according to the present invention.

A pulse width modulator according to the present invention is illustrated in FIG. 5. Sources 70 and 78 and resistors 72 and 80 are analogous to the like numbered elements in FIG. 3. The negative resistance diode 76 is also analogous to the diode 76 of FIG. 3. The voltage-current characteristic for the diode is as shown in FIG. 1 and the load line is as indicated at 20.

The anode 74 of the diode 76 is connected through an impedance matching means 110 to the sending end of an electronically controllable delay line 112. The impedance matching means 110 may be a transformer or any other known impedance matching means. The electronically controllable delay line is also well-known and the delay it introduces is controlled by a modulating signal from source 114. This modulating signal is applied to the delay line elements as, for example, the inductive or capacitive elements so as to change their value and thereby change the delay. Some forms of such lines are described in Patent No. 2,565,231, dated August 21, 1951, issued to G. Hipp and Patent No. 2,852,750, dated September 16, 1958, issued to E. A. Goldberg.

In operation, pulses, preferably spaced at fixed intervals, are applied from source 78 to the diode-anode. These switch the diode from one stable state to another and, after reflection from the receiving end of the delay line, switch the diode back to its first stable state. Square pulses are thereby produced at the diode-anode and output terminal 116. The effective length of the delay line is controlled in accordance with a modulating signal from source 114. The square pulses produced at the diode-anode thereby vary in width in accordance with the amplitude of the modulating signal. The output may be taken at the diode-anode but preferably is taken at terminals 116 located between the impedance matching means and the delay line.

In the embodiments of the invention discussed above, the diode is assumed to be in its low voltage state initially, and the pulses applied are said to be forward bias pulses. The square output pulses produced are positive. It should be appreciated that other modes of operation are equally feasible. For example, the diode may initially be in its high voltage state, the pulses applied may be reverse bias pulses, and the output pulses produced may be negative-going. Moreover, in all embodiments of the invention, the diode may be reversed in polarity and the sources reversed accordingly.

I claim:

1. In combination, a tunnel diode; a substantially constant current source connected to the diode for applying a forward bias current to the diode of a value to maintain the diode in one of its positive resistance stable operating regions; a delay line coupled at its sending end to the diode and mis-matched at its receiving end; and means for applying current pulses to the diode having an amplitude sufficient to switch the diode to its other positive resistance operating region and to produce a signal of sufficient amplitude, after reflection from the receiving end of the delay line, to switch the diode back to its one positive resistance operating region.

2. In combination, a negative resistance diode of the voltage controlled type normally operating in one of its positive resistance regions; an electronically controllable delay line which is short-circuited at its receiving end and coupled at its sending end to said diode; means for applying periodically recurring pulses to said diode having a polarity and amplitude sufficient to switch the diode from its first to its second stable state and, to produce reflections from the short-circuited end of said delay line which switch the diode back from its second to its first stable state; and means for applying a modulating signal to said delay line for controlling the delay imparted by the line.

3. In combination, a tunnel diode; a substantially constant current source connected to the diode for applying a forward current to the diode of a value to maintain the diode in one of two stable voltage states; a delay line which is terminated at its sending end in said tunnel diode and is terminated at its receiving end in an open circuit; and means for applying a current pulse to the diode having an amplitude sufficient to switch the diode from one of its stable voltage states to the other and to produce a reflection from the open end of the delay line, back to the diode, back to the open end of the delay line, back to the diode, to switch the diode back to its first stable state.

4. In combination, a negative resistance diode which is capable of assuming two stable voltage states; means coupled to the diode which switches the same from one of said voltage states to the other; and a delay line which is mismatched at its receiving end coupled at its sending end to the diode for receiving the change in voltage which occurs when the negative resistance diode switches to said other voltage state and for producing a reflected signal which switches the diode back to its original voltage state.

5. In combination, a negative resistance diode which is capable of assuming two stable voltage states; means coupled to the diode for applying a forward bias current to the diode; means coupled to the diode for applying a current pulse to the diode which switches the same from one of said voltage states to the other; and a delay line which is mismatched at both ends coupled at its sending end to the diode for receiving the change in voltage which occurs when the negative resistance diode switches to said other voltage state and for producing a reflected signal which switches the diode back to its original voltage state.

6. In combination, a negative resistance diode which is capable of assuming two stable voltage states; means coupled to the diode which switches the same from one of said voltage states to the other; and an electronically controllable delay line which is mis-matched at its receiving end coupled at its sending end to the diode for receiving the change in voltage which occurs when the negative resistance diode switches to said other voltage state and producing a reflected signal which switches the diode back to its original voltage state.

7. A negative resistance diode which is capable of assuming two stable voltage states; means for applying a pulse to the diode which switches the diode from one of its stable voltage states to the other; an electronically controllable delay line which is short-circuited at its receiving end and coupled at its sending end to said diode for receiving the change in voltage which occurs when the diode switches its voltage state and producing a reflected signal which switches the diode back to its original voltage state; and means for applying a modulating signal to said delay line for controlling the delay imparted by the delay line.

References Cited in the file of this patent

UNITED STATES PATENTS

| | | |
|---|---|---|
| 2,829,346 | Hughes et al. | Apr. 1, 1958 |
| 2,843,765 | Aigrain | July 15, 1958 |
| 2,874,355 | Hernquist | Feb. 17, 1959 |
| 2,944,164 | Odell et al. | July 5, 1960 |

FOREIGN PATENTS

| | | |
|---|---|---|
| 634,716 | Great Britain | Mar. 29, 1950 |
| 757,477 | Great Britain | Sept. 19, 1956 |
| 987,446 | France | Apr. 18, 1951 |

OTHER REFERENCES

Tunnel Diodes as High-Frequency Devices, by Sommers, Proceedings of the IRE, July 1959, pp. 1202 to 1206.